United States Patent [19]

Wada et al.

[11] 4,269,653
[45] May 26, 1981

[54] APERTURE STOP

[75] Inventors: Hirotsugu Wada, Machida; Toshiaki Shinozaki, Yokohama, both of Japan

[73] Assignee: VLSI Technology Research Association, Japan

[21] Appl. No.: 91,037

[22] Filed: Nov. 5, 1979

[30] Foreign Application Priority Data

Nov. 6, 1978 [JP] Japan .................. 53-136483

[51] Int. Cl.$^3$ .......................................... B23P 15/16
[52] U.S. Cl. .................................. 156/644; 156/647; 156/656; 156/657; 156/661.1; 156/662; 156/664; 2640/219
[58] Field of Search ............... 156/629, 630, 632, 644, 156/647, 649, 656, 657, 662, 661.1, 664; 264/219, 337; 430/314; 249/134; 164/138

[56] References Cited

U.S. PATENT DOCUMENTS

| | | | |
|---|---|---|---|
| 3,052,581 | 9/1962 | Gutknecht | 264/219 |
| 3,303,254 | 2/1967 | Simons | 264/219 |
| 3,679,500 | 7/1972 | Kubo et al. | 156/644 |
| 3,801,390 | 4/1974 | Lepselter et al. | 156/644 |
| 3,923,566 | 12/1975 | Law | 156/644 |
| 3,936,329 | 2/1976 | Kendall et al. | 156/647 |
| 3,984,620 | 10/1976 | Robillard | 29/627 |
| 3,988,153 | 10/1976 | Politycki | 156/644 |
| 4,058,432 | 11/1977 | Wolden et al. | 156/661.1 |
| 4,106,975 | 8/1978 | Berkenblit et al. | 156/647 |
| 4,106,976 | 8/1978 | Chiou et al. | 156/644 |
| 4,172,005 | 10/1979 | Muroaka et al. | 156/647 |

FOREIGN PATENT DOCUMENTS 5130679 6/1979 Japan .

OTHER PUBLICATIONS

Bassous et al., "The Fabrication ... Silicon", Journal of Electrochemical Society, No. 8, vol. 125, pp. 1321-1327, (1978).

*Primary Examiner*—Jerome W. Massie
*Attorney, Agent, or Firm*—Finnegan, Henderson, Farabow, Garrett & Dunner

[57] ABSTRACT

A method of manufacturing an aperture stop with a rectangular aperture for an electron beam exposure device, comprising the steps of: preparing a single-crystal silicon substrate with one side having a (100) face; providing a mask on said side of the substrate; selectively etching the substrate through the mask from said side to form a projecting portion of rectangular cross section by anisotropic etching; forming an aperture layer by covering said one side of the etched substrate with a high-melting-point metal having good electric conductivity, thereby surrounding said projecting portion; and forming in said aperture layer a rectangular aperture with a cross section corresponding to the cross section of said projecting portion by removing said substrate from the aperture layer.

4 Claims, 14 Drawing Figures

APERTURE STOP

This invention relates to a method for manufacturing an aperture stop which defines the sectional shape of electron beams in an electron beam exposure device, for example.

Electron beam exposure devices, especially ones which variably control the sectional dimensions of electron beams, require an aperture stop with high dimensional accuracy. The aperture stop of this type has hitherto been formed by etching a sheet of e.g. molybdenum (Mo) to bore an aperture therethrough. However, the dimensional accuracy of the aperture opening is very low, suffering a dimensional error as large as the thickness of the sheet, for example. As stated in the recent Japanese Utility model Disclosure (Kokai) No. 1977/130,679, there has been proposed a method to manufacture an aperture stop by anisotropic etching of a silicon plate of a single-crystal. Such aperture stop, however, is subject to several defects. Namely, the material is limited to a single crystal, and the shape of the aperture opening would be determined by the crystal structure and anisotropic etching. Moreover, there would be caused errors equivalent to variations in the thickness of the single-crystal plate.

The object of this invention is to provide a method for manufacturing an aperture stop readily affording a desired aperture shape and capable of selection among various materials according to the application and high-accuracy formation of aperture.

A method for manufacturing an aperture stop according to one aspect of this invention comprises the steps of preparing a substrate, forming a projecting portion by etching one side of the substrate, forming an aperture layer by covering one side of the etched substrate with an aperture material, whereby the projecting portion is surrounded, and forming in the aperture layer an aperture with a cross section corresponding to the cross section of the projecting portion by removing the substrate.

This invention can be more fully understood from the following detailed description when taken in conjunction with the accompanying drawings, in which.

Now there will be described a method for manufacturing an aperture stop according to an embodiment of this invention with reference to the accompanying drawings.

Figure 1A:
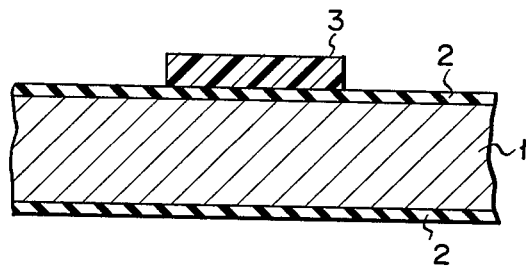
FIGS. 1A to 1D are views for illustrating the method for manufacturing an aperture stop according to a first embodiment of this invention.
Figure 1B:
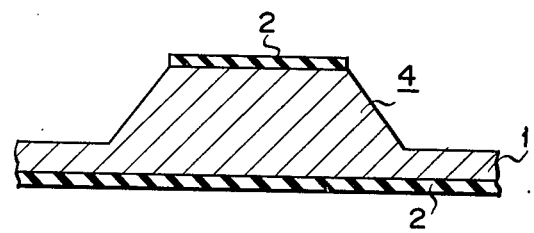
Figure 1C:
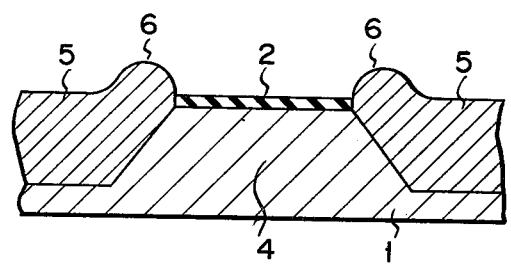
Figure 1D:
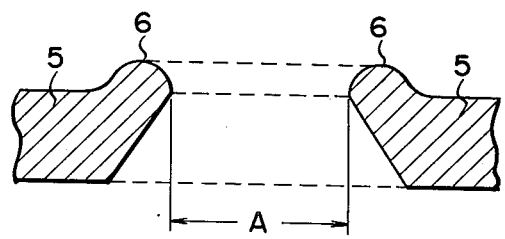

First, a single-crystal silicon wafer 1 with the main surface formed of (100) face is prepared, and silicon dioxide layers 2 are formed all over the main surface and the bottom surface of the wafer 1 by the well-known thermal oxidation method. Then, a resist pattern 3 of predetermined shape and size is formed on the top of the silicon dioxide layer 2 on the main surface of the wafer, as shown in FIG. 1A. In this embodiment, the resist pattern 3 is formed accurately into a square with a side length of approximately 100 $\mu$m by electron beam exposure, for example. Thereafter, the upper silicon dioxide layer 2 is selectively removed by etching with the resist pattern 3 as a mask, and then the silicon wafer 1 is subjected to anisotropic etching with the remaining portion of the silicon dioxide layer 2 used as a mask, as shown in FIG. 1B. The anisotropic etching may be achieved by using, for example, an aqueous solution (60° C.) of potassium hydroxide and isopropyl alcohol. Thus, by such anisotropic etching, a rectangular-trapezoidal projecting portion 4 with lateral sides of (111) face is formed with high dimensional accuracy. Then, as shown in FIG. 1C, an aperture layer 5 of highly electric conductive metal, such as Au, Ag, Cu, is formed on the top of the silicon wafer 1 by electroplating. Thereafter, the remaining portion of the silicon dioxide layer 2 is removed by a solution of ammonium fluoride, and then the silicon wafer 1 is removed by plasma-etching or alkaline solution, thereby completing an aperture stop as shown in FIG. 1D. When forming the aperture layer 5 thick in the process of FIG. 1C, a projecting portion 6 is created around the opening, which will not, however, do any harm to the finished aperture stop. The projecting portion 6 may be removed by grinding, if necessary.

The aperture stop produced in the aforementioned manner has an aperture dimension A which is equal to the sectional dimension defined by the anisotropic etching, so that it may enjoy very high dimensional accuracy. Unlike the prior art method, the method of this invention requires no inverse operation of the mask opening dimension from the aperture dimension and material, leading to hardly any noticeable error. Further, there will be caused no errors attributable to changes in thickness of the aperture material. Moreover, the manufacture may be facilitated because the only requirement is that the sectional dimension of the projecting portion 4, especially the mask dimension of the silicon dioxide layer 2, be determined with high accuracy. Additionally, the aperture material may be selected optionally according to the application.

Figure 2A:
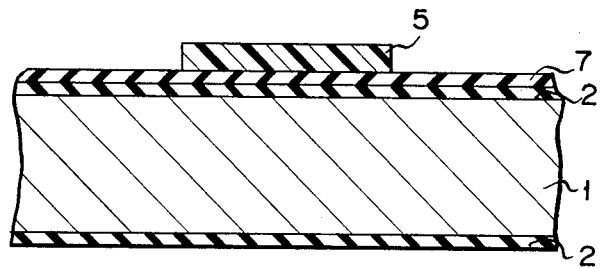
FIGS. 2A and 2B are views for illustrating the method for manufacturing an aperture stop according to a second embodiment of the invention.
Figure 2B:
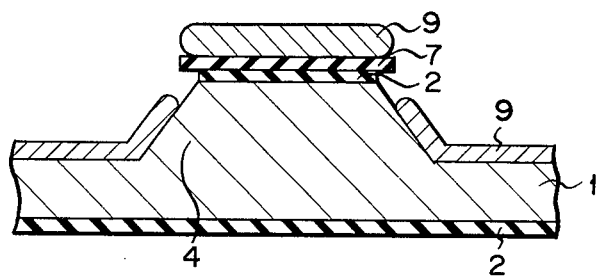

Referring now to FIGS. 2A and 2B, there will be described a manufacturing method according to a second embodiment of this invention.

Like the case of FIG. 1A, silicon dioxide layers 2 are formed on both surfaces of a (100) face of a single-crystal wafer 1. Then, a silicon nitride layer 7 as an anti-etching mask is formed on the upper silicon dioxide layer 2, and in turn a resist pattern 5 of predetermined dimensions is formed on the layer 7, as shown in FIG. 2A. Then, the silicon nitride layer 7 is selectively removed by plasma-etching with the resist pattern 5 as a mask, leaving the portion under the resist pattern 5 as it is. Subsequently, the silicon dioxide layer 2 is selectively removed by etching with the remaining portion of the silicon nitride layer 7 as a mask. This etching process can be achieved easily by using an aqueous solution of ammonium fluoride. Then, after confirming that the silicon dioxide layer 2 is securely removed in such etching process except the portion under the silicon nitride layer 7, etching is further continued. The time required for the continued etching is preferably ten minutes to scores of minutes for a case where silicon dioxide provided by thermal oxidation is etched by using an aqueous solution of ammonium fluoride at a temperature of 25° C., and is a few minutes to ten minutes for a case where silicon dioxide formed by CVD method is etched. Thereafter, the silicon wafer 1 is subjected to anisotropic etching to form a projecting portion 4 of a predetermined shape. In this case, the silicon nitride layer 7 remaining on the projecting portion 4 may have a dimension greater than that of the top surface of the projecting portion 4 by thousands of angstroms to several microns. Such dimensional difference may, however, be limited within several hundreds of angstroms. Then, the top of the single-crystal silicon wafer 1 with two layers 2, 7 mounted thereon is covered with a high-melting-point metal such as Mo, W, Ta and Ti, or a metal such as Au and Ag by ion-plating, CVD, evaporation or sputtering, thereby forming an aperture layer 9 as shown in FIG. 2B. Thereafter, if necessary, a metal plating may be applied to form a high-accuracy pattern. Thus, when the single-crystal wafer 1 is removed by etching, the silicon dioxide layer 2 the silicon nitride layer 7 and the part of the metal layer 9 thereon are simultaneously lifted off to provide an aperture stop which is formed only of the aperture layer 9.

Figure 3A:
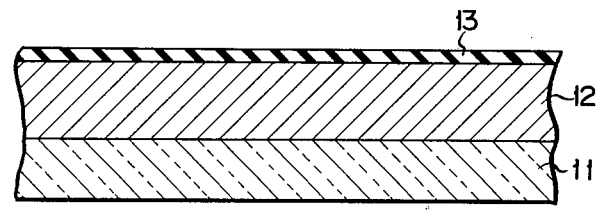
FIGS. 3A to 3C are views for illustrating the method for manufacturing an aperture stop according to a third embodiment.
Figure 3B:
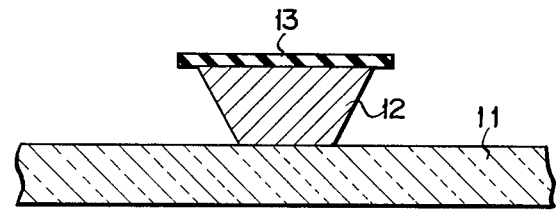
Figure 3C:
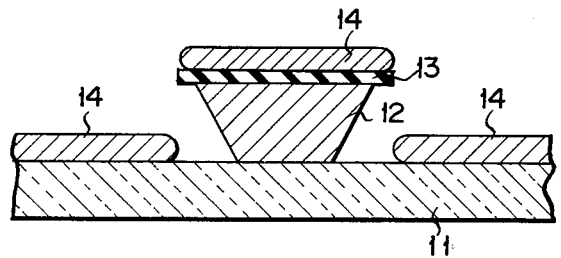

Referring now to FIGS. 3A to 3C, there will be described a manufacturing method according to a third embodiment of this invention.

A silicon layer 12 is formed on a sapphire substrate 11 by epitaxial growth method, and a silicon dioxide layer 13 is formed on the silicon layer 12 by thermal oxidation or CVD methods, thereby providing a wafer of SOS construction, as shown in FIG. 3A. The silicon dioxide layer 13 is patterned into a predetermined shape by the conventional photo-etching method, and then the silicon layer 12 is subjected to anisotropic etching with the patterned silicon dioxide layer 13 as a mask, as shown in FIG. 3B. When the silicon layer 12 is subjected to over-etching, part of the layer 12 is left in the form of an island with inversely tapered side as illustrated, the insular portion functioning as a projecting portion 12. The silicon dioxide layer 13 located on the insular portion has a greater dimension than that of the top of the insular portion 12. Namely, the silicon dioxide portion 13 is extended outward in the horizontal direction beyond the insular portion. The sapphire substrate 11 is covered with a metal as an aperture material by evaporation of sputtering method, thereby forming an aperture layer 14 as shown in FIG. 3C. Then, the aperture layer 14 is plated with the same or different kind of metal (not shown) the remaining silicon layer 12 is removed by etching, and the silicon dioxide layer 13 on the layer 12 and part of the aperture layer 14 are removed at the same time. Thereafter, the sapphire substrate 11 is removed by phosphoric acid or the like to provide a metal aperture stop.

Referring now to FIGS. 4A to 4D, there will be described a fourth embodiment of this invention.

Figure 4A:
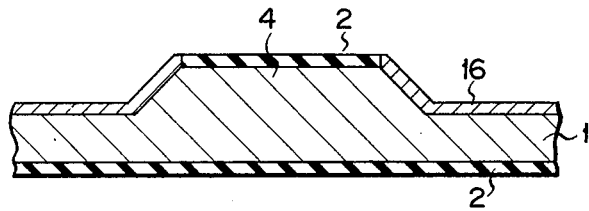
FIGS. 4A to 4D are views for illustrating the method for manufacturing an aperture stop according to a fourth embodiment.
Figure 4B:
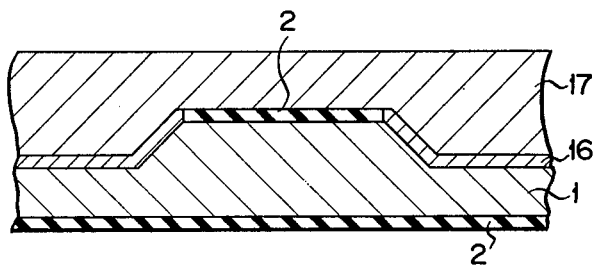
Figure 4C:
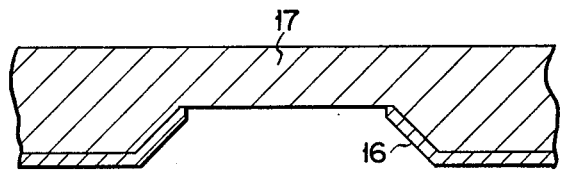
Figure 4D:
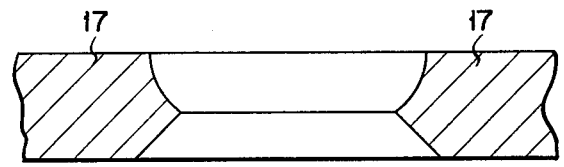

A projecting portion 4 with a desired top shape is formed on a single-crystal silicon substrate or wafer 1 in the same manner as shown in FIG. 1B for the first embodiment. Then, the top of the projecting portion 4 and the bottom of the silicon substrate 1 are each covered with a silicon dioxide layer 2, and a metal layer 16 is selectively formed on the top of the silicon substrate 1 by e.g. plating, as shown in FIG. 4A. Thereafter, an aperture layer 17 is formed over the silicon substrate 1 with the silicon dioxide layer 2 and the metal layer 16 between, as shown in FIG. 4B. The aperture layer 17 may be formed from polycrystalline Si, SiN4, BP, BN, U, Au or W by CVD, evaporation, ion-plating, ion-sputtering, etc. according to the material used. The formation of the aperture material may otherwise be performed after removing the silicon dioxide layer 2. After the silicon dioxide layer 2 and the silicon substrate 1 are removed as shown in FIG. 4C, the aperture layer 17 is selectively etched from the metal layer 16 side with the layer 16 used as a mask. By removing the metal layer 16 by etching, a stop with desired aperture shape and dimension corresponding to the projecting portion 4 can be obtained, as shown in FIG. 4D. If one uses, in etching the aperture layer 17 from the back side thereof, a method by which the layer 17 will be etched also from other portions than the back side, it is necessary, to form in advance an anti-etching layer on the top surface of the aperture layer 17.

The aforementioned methods are all suited for the manufacture of a stop with a rectangular aperture. In these cases, the projecting portions with the rectangular cross sections are formed by using masks similar to such sections. In order to improve the accuracy of the rectangularity of the cross section of the projecting portion, it is preferable that substantially square extended portions be provided at the four corners of the mask, thereby compensating for the narrow difference between the degree of etching from the corners and that of sideway etching.

Figure 5:
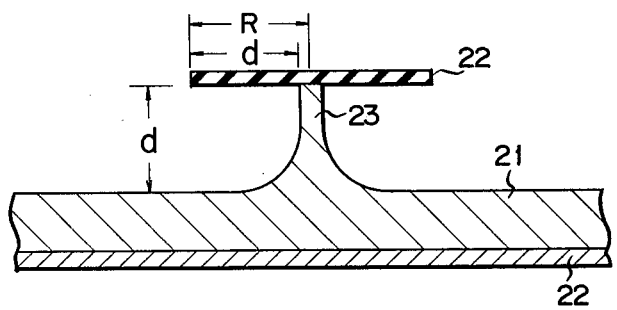
FIG. 5 is a view for illustrating the method for manufacturing an aperture stop according to a fifth embodiment.

Referring now to FIG. 5, there will be described a method for manufacturing a stop with a circular aperture.

Layers 22 of silicon dioxide or silicon nitride as anti-etching masks are formed on both surfaces of a substrate 21 formed of single-crystal silicon or polycrystalline silicon. Thereafter, the upper layer 22 is removed by the above-mentioned selective etching method to leave a circular portion with a radius R, exposing part of the top of the substrate 21 other than the portion corresponding to the remaining portion of the layer 22. Then, the exposed portion of the substrate 21 is etched by an alkaline solution of an ester, employing the circular portion 22 as a mask. Thus, a columnar projecting portion 23 with a height of d and a radius of R-d is formed. This etching is isotropic etching which may be controlled with a dimensional accuracy of scores of angstroms by normal general-use control. Thereafter, as in the above-mentioned embodiments, the substrate 21 is covered with a metal to provide a stop which has an aperture with the same diameter as that of the projecting portion 23. Since the projecting portion 23 has a smoothly curved peripheral surface which gradually spreads out downward, the aperture of the formed stop may have a dimension smoothly narrowed down across the thickness of the stop. Thus, the stop may exhibit its outstanding faculty as a nozzle for fluids.

According to the method of this invention, as described above in connection with the several embodiments, the aperture opening dimension may easily be determined with high accuracy. Further, the aperture material may be selected among various materials according to the applicaton, and the manufacturing processes are simple. Furthermore, the method of the invention will not require any special processing for dimension control. Thus, significant advantages may be obtained, in an aperture stop with high dimensional accuracy may be manufactured easily at low cost from a material in compliance with the application, without limitation to the shape of the aperture opening.

This invention is not limited to the above-mentioned precise embodiments. For the substrate, for example, may be used other suitable materials than Si, including a multilayer substrate combining single-crystal Si with an ion crystal or some different type of material. The appplications of the aperture stop include fluid nozzles for ink jet printers and optical apertures for laser systems, as well as apertures for corpuscular beam devices. Further, the thickness and other details of the aperture may be determined suitably as required. In short, various changes and modifications may be effected without departing from the scope or spirit of this invention.

What we claim is:

1. A method of manufacturing an aperture stop with a rectangular aperture for an electron beam exposure device, comprising the steps of:
   (a) preparing a single-crystal silicon substrate with one side having a (100) face;
   (b) providing a mask on said side of the substrate;
   (c) selectively etching the substrate through the mask from said side to form a projecting portion of rectangular cross section by anisotropic etching;
   (d) forming an aperture layer on said one side of the etched substrate surrounding said projecting portion, said layer being comprised of a high-melting-point metal having good electric conductivity; and
   (e) forming in said aperture layer a rectangular aperture with a cross section corresponding to the cross section of said projecting portion by removing said substrate from the aperture layer.

2. The method according to claim 1, wherin said mask comprises a silicon oxide layer which is selectively etched to have a rectangular shape.

3. The method according to claim 1, wherein said mask comprises a silicon oxide layer located on the substrate and a silicon nitride layer formed on the silicon oxide layer.

4. The method according to claim 2 or 3, wherein said high-melting-point metal is selected from the group consisting of molybdenum, tungsten, tantalum and titanium.

* * * * *